(12) United States Patent
Shu

(10) Patent No.: US 7,116,112 B1
(45) Date of Patent: Oct. 3, 2006

(54) APPARATUS FOR TESTING ELECTRIC CABLES

(75) Inventor: Bin Shu, Shenzhen (CN)

(73) Assignees: Hong Fu Jin Precision Industry Co., Ltd., Shenzhen (CN); Hon Hai Precision Industry Co., Ltd., Taipei Hsien (TW)

( * ) Notice: Subject to any disclaimer, the term of this patent is extended or adjusted under 35 U.S.C. 154(b) by 0 days.

(21) Appl. No.: 11/370,791

(22) Filed: Mar. 8, 2006

(30) Foreign Application Priority Data

Mar. 12, 2005 (CN) .................. 2005 1 0033642

(51) Int. Cl.
*G01R 31/02* (2006.01)

(52) U.S. Cl. ...................... 324/539; 324/542

(58) Field of Classification Search ........... 324/539, 324/542

See application file for complete search history.

(56) References Cited

U.S. PATENT DOCUMENTS 4,471,293 A * 9/1984 Schnack ............... 324/540
4,736,158 A * 4/1988 McCartney ............... 324/66
5,280,251 A * 1/1994 Strangio ............... 324/539
5,436,554 A * 7/1995 Decker, Jr. ............... 324/66

* cited by examiner

*Primary Examiner*—Walter Benson
(74) *Attorney, Agent, or Firm*—Morris Manning & Martin; Tim Tingkang Xia, Esq.

(57) ABSTRACT

A cable test apparatus includes a power supply terminal, an open circuit indicator with an anode connected to the power supply terminal, a short circuit indicator, a first interface, a second interface, and a switch. The first interface and the second interface have a plurality of pins thereon. In the first interface, a first pin is connected to a cathode of the open circuit indicator, a second pin is connected to an anode of the short circuit indicator, a third pin is grounded, the other pins are shorted. The pins of the second interface are shorted as well. Therefore all wires of the cable are connected in series, even wires located at one side of the short circuit indicator, and odd wires are located at the other side of the short circuit indicator. In a short circuit test, the switch connects the second pin and a fourth pin; in an open circuit test, the switch connects the fourth pin and the cathode of the short circuit indicator and shorts the open circuit indicator.

20 Claims, 3 Drawing Sheets

APPARATUS FOR TESTING ELECTRIC CABLES

BACKGROUND OF THE INVENTION

1. Technical Field

The present invention relates generally to test equipment and more specifically to an apparatus for testing cables used in electronics.

2. Background

During the installation of and interconnection of various equipment in computers, it is necessary to make frequent wire checks verifying the integrity of connections made by means of cables utilized to interconnect various equipment. It is necessary that the cable be checked for a number of wire faults, such as shorts and opens. A number of test apparatuses have been developed for making checks of cable for shorts and opens. One such apparatus is disclosed in CN. Pat. No. 00200774.6, wherein a cable having connectors at opposite ends is checked for faults. The testing apparatus includes two interfaces for receiving the connectors of the cable being tested, a switch array, and a plurality of indicators for indicating the condition of the cable. Such a test apparatus, however, needs many switches and indicators and is therefore a complex method of testing.

It is therefore apparent that a need exits to provide a less complex apparatus for testing the cable with less switches and less indicators.

SUMMARY

A cable test apparatus includes a power supply terminal, an open circuit indicator with an anode connected to the power supply terminal, a short circuit indicator, a first interface, a second interface, and a switch. The first interface and the second interface have a plurality of pins thereon. In the first interface, a first pin is connected to a cathode of the open circuit indicator, a second pin is connected to an anode of the short circuit indicator, a third pin is grounded, the other pins are shorted. The pins of the second interface are shorted as well. Therefore all wires of the cable are connected in series, even wires located at one side of the short circuit indicator, and odd wires are located at the other side of the short circuit indicator. In a short circuit test, the switch connects the second pin and a fourth pin; in an open circuit test, the switch connects the fourth pin and the cathode of the short circuit indicator and shorts the open circuit indicator.

The testing apparatus of the present invention only needs a switch, an open circuit indicator, and a short circuit indicator to indicate the state of the cables. It is of advantage that the cable testing apparatus is simple to manufacture.

Other advantages and novel features will become more apparent from the following detailed description when taken in conjunction with the accompanying drawings, in which:

DETAILED DESCRIPTION OF THE EMBODIMENTS

Figure 1:
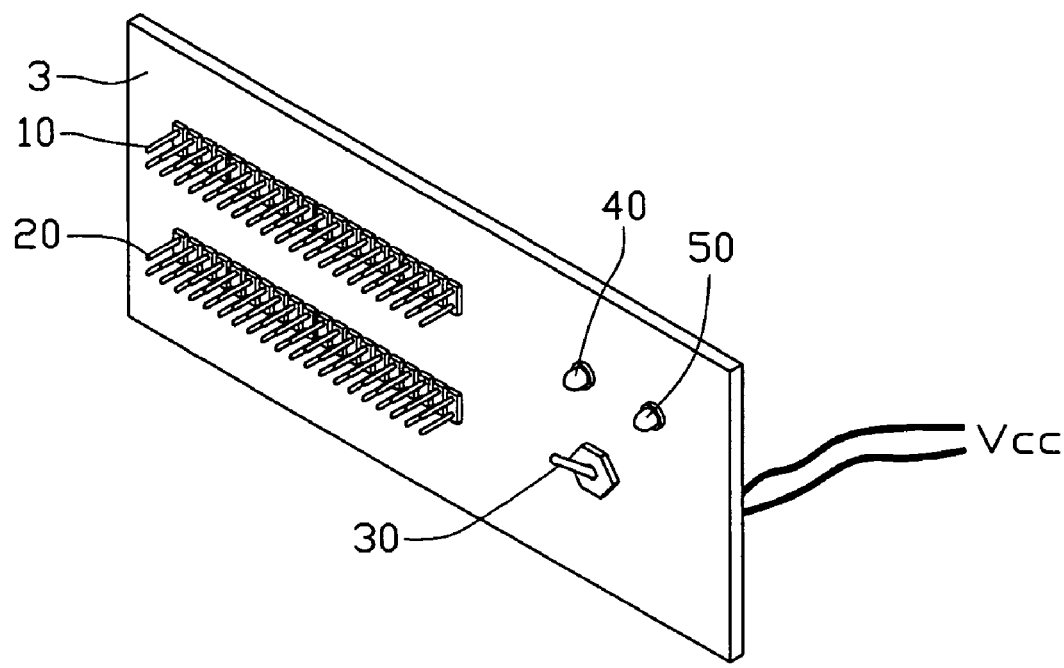
FIG. 1 is an isometric view of a cable testing apparatus in accordance with a preferred embodiment of the present invention.

FIG. 1 is an isometric view of a cable testing apparatus in accordance with a preferred embodiment of the present invention. The testing apparatus includes a first interface 10, a second interface 20, a double-pole double-throw (DPDT) switch 30, an open circuit indicator 40, and a short circuit indicator 50 all mounted on a plate 3. The open circuit indicator 40 and the short circuit indicator 50 are light emitting diode (LED) indicators or some other kind of indicators. The first interface 10 and the second interface 20 comprise a plurality of pins.

Figure 2:
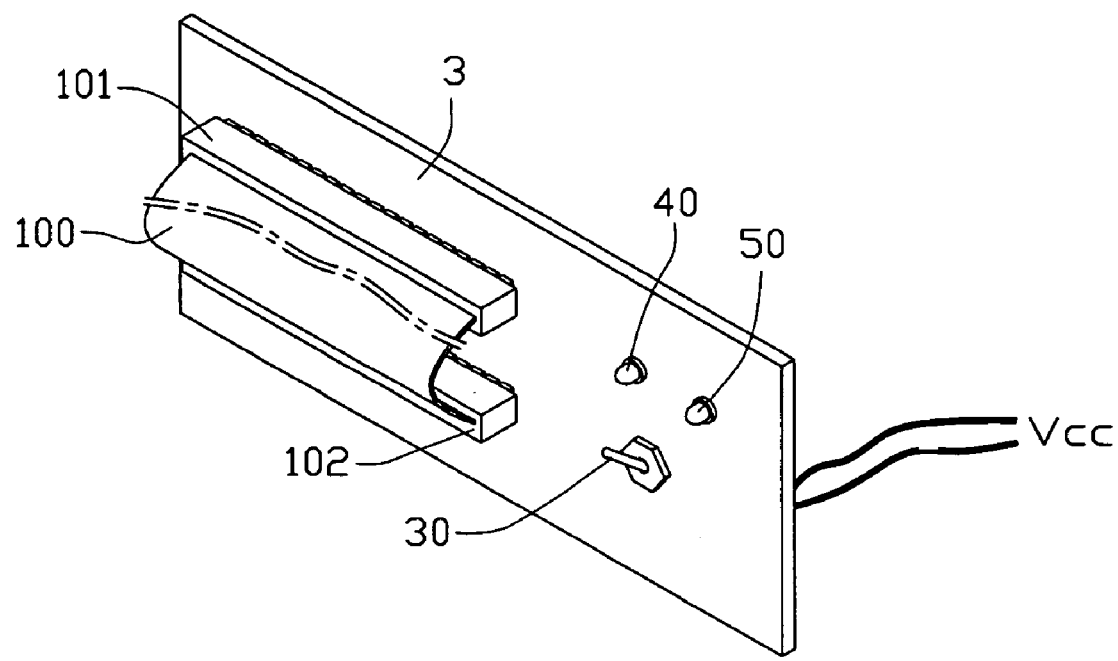
FIG. 2 is an isometric view of the testing apparatus of FIG. 1, together with a cable to be tested.

FIG. 2 is an isometric view of the testing apparatus in accordance with the preferred embodiment of the present invention, together with a cable 100 to be tested. The cable 100 has a number of wires that are connected between a first connector 101 and a second connector 102. The first connector 101 can be plugged into the first interface 10, and the second connector 102 can be plugged into the second interface 20.

Figure 3:
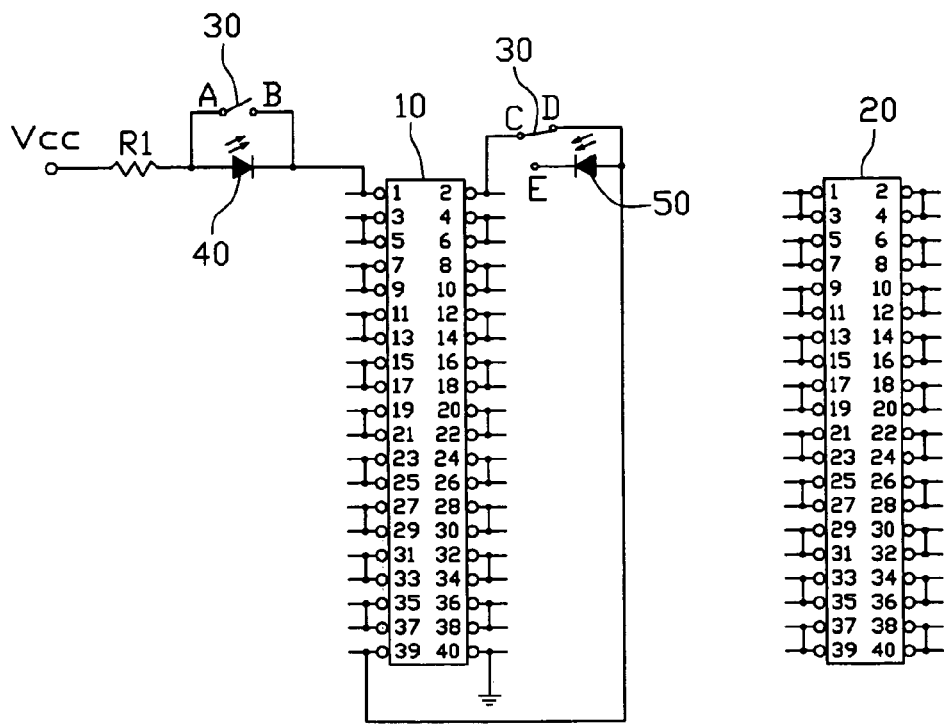
FIG. 3 is circuit diagram of the testing apparatus of FIG. 1.

FIG. 3 is a circuit diagram of the testing apparatus in accordance with the preferred embodiment of the present invention. A power supply terminal Vcc is connected to an anode of the open circuit indicator 40 via a resistor RI, a cathode of the open circuit indicator 40 is connected to a first pin a1 (FIG. 4) of the first interface 10, a second pin a39 is connected to an anode of the short circuit indicator 50, and a third pin a40 is grounded. A first contact A of the DPDT switch 30 is connected to the anode of the open circuit indicator 40, and a second contact B of the DPDT switch 30 is connected to the cathode of the open circuit indicator 40. A third contact C of the DPDT switch 30 is connected to a fourth pin a2 of the first interface 10, a fourth contact D of the DPDT switch 30 is connected to the second pin a39, and a fifth contact E of the DPDT switch 30 is connected to the cathode of the short circuit indicator 50. Every two adjacent odd pins of the first interface 10 are connected except the first pin a1, the second pin a39, the third pin a40, and the fourth pin a2, i.e. pins a3 and a5 are electronically connected, pins a7 and a9 are electronically connected, ... pins a35 and a37 are electronically connected; every two adjacent even pins of the first interface 10 are electronically connected, i.e. pins a4 and a6 are electronically connected, pins a8 and a10 are electronically connected, ... pins a36 and a38 are electronically connected. Every two adjacent odd pins of the second interface 20 are electronically connected, i.e. pins b1 and b3 are electronically connected, pins b5 and b7 are electronically connected, ... pins b37 and b39 are electronically connected; every two adjacent even pins are electronically connected, i.e. pins b2 and b4 are electronically connected, pins b6 and b8 are electronically connected, ... pins b38 and b40 are electronically connected.

When the cable 100 is attached to the testing apparatus, the pins of the first interface 10 and the second interface 20 are connected via the wires of the cable 100, that is, pins a1 and b1, pins a2 and b2, ... pins a40 and b40 are all connected to each other.

Figure 4:
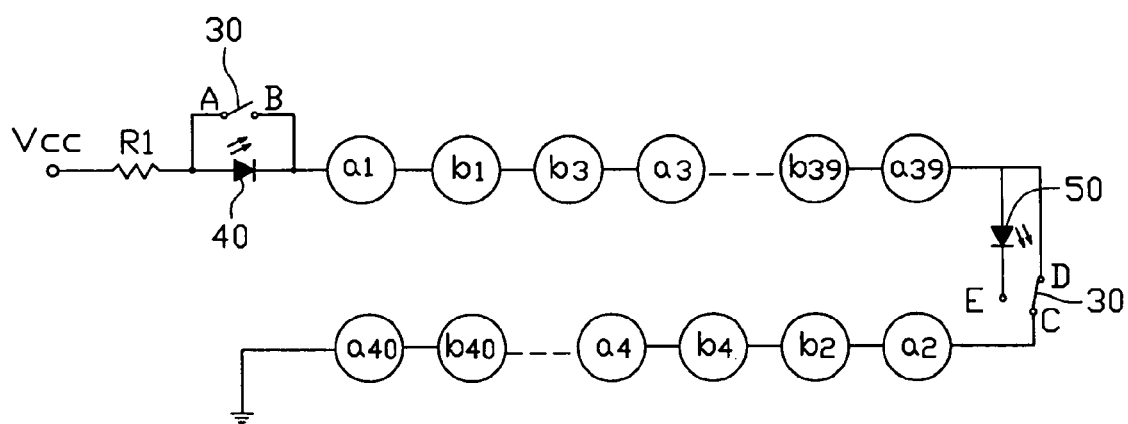
FIG. 4 is a circuit diagram of the testing apparatus of FIG. 1, together with a cable to be tested.

Referring to FIG. 4, between the second contact B and the fourth contact D, the odd pins of the first interface 10 and the second interface 20 are connected in sequence, that is, the pin a1 is connected to the pin b1, the pin b1 is connected with the pin b3, the pin b3 is connected to the pin a3 and so on, via the cable 100, and between the third contact C and the ground, the even pins of the first interface 10 and the second interface 20 are connected in sequence, that is, the pin a2 is connected to the pin b2, the pin b2 is connected with the pin b4, the pin b4 is connected to the pin a4 and so on, via the cable 100, in this way, when the appropriate contacts of the DPDT are closed a test circuit is formed.

In testing the cable 100, the cable 100 is mounted to the testing apparatus with the first connector 101 plugged in to the first interface 10 and the second connector 102 plugged into the second interface 20. In the open circuit test, the contacts C and D are closed, the contacts A and B are open, and the contacts C and E are open, thus the open circuit indicator 40 is included in the testing circuit, and the short circuit indicator 50 is not. If the cable 100 has one or more opens or bad connections in the wires, the test circuit will be open as well, and the open circuit indicator 40 remains unlit. If there are no opens in the cable 100, the test circuit will be complete and the open circuit indicator 40 will be lit to indicate the cable 100 is normal.

If a short is present in the cable 100 it will occur between two adjacent wires, that is: short circuit occurs between an odd wire and its adjacent even wire. The odd wire is the wire between the odd pin of the first interface 10 and the corresponding odd pin of the second interface 20. The even wire is the wire between the even pin of the first interface 10 and the corresponding even pin of the second interface 20.

In the short circuit test, the contacts A and B are closed, the contacts C and E are closed, and the contacts C and D are open, thus, the short circuit indicator 50 is included in the testing circuit, and the open circuit indicator 40 is shorted. If there is a short between two adjacent wires, the short circuit indicator 50 will be shorted as well and remain unlit. If there are no shorts in the cable 100, the short circuit indicator 50 will light to indicate the cable 100 is normal.

Figure 5:
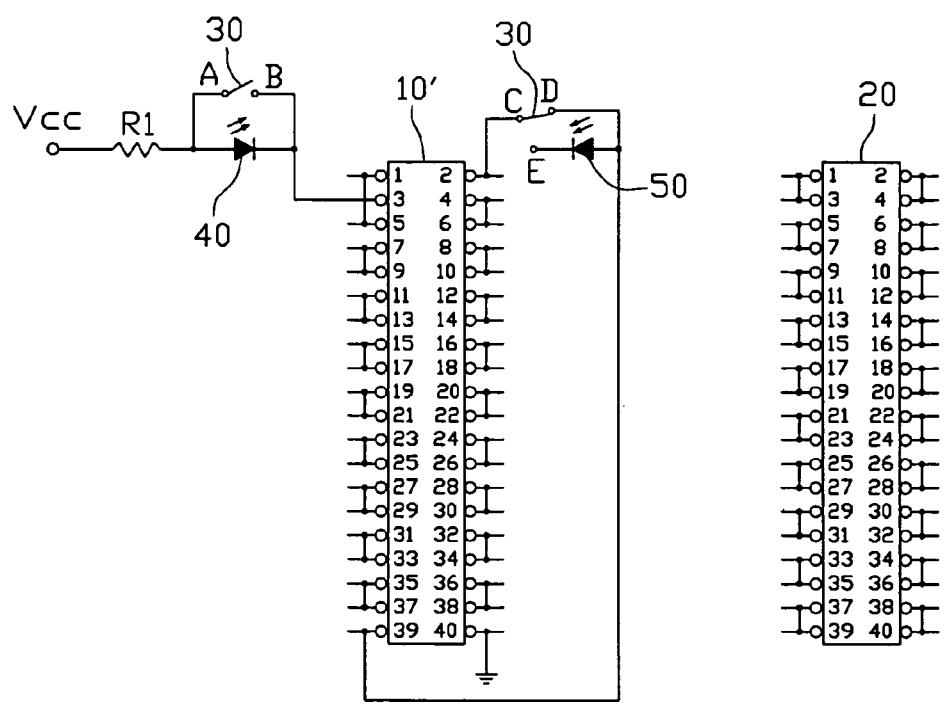
FIG. 5 is a circuit diagram of a testing apparatus in accordance with another preferred embodiment of the present invention.
Figure 6:
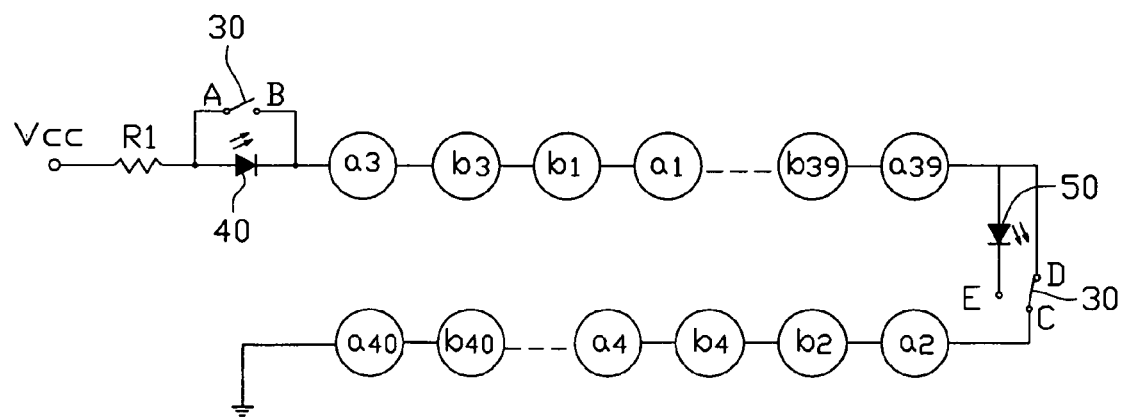
FIG. 6 is a circuit diagram of the testing apparatus of FIG. 5, together with the cable to be tested.

Another embodiment of the testing apparatus is shown in FIG. 5. The first pin, second pin, third pin, and fourth pin are the pins a3, a39, a40, and a2 of the first interface 100 respectively. The circuit diagram using the testing apparatus to test the cable 100 is shown in FIG. 6. The pin a1 is connected with the pin a5. The present embodiment can also test wire faults, such as open wires and shorts between wires.

The first pin, the second pin, the third pin, and the fourth pin can be other pins of the first interface 10, all the odd wires are at one end of the short circuit indicator 50, and all the even wires are at the other end of the short circuit indicator 50, when there is a short between two adjacent wires, the short circuit indicator 50 will indicate a fault in the cable.

Moreover, the DPDT switch can be replaced by other switches, for example, the switch between the first contact A and the second contact B can be a single-pole single-throw (SPST) switch, the switch among the third contact C and the fourth contact D and the fifth contact E can be a single-pole double throw (SPDT) switch.

It is to be understood, however, that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An apparatus adapted for testing a cable having a plurality of wires, the apparatus comprising:
    a power supply terminal;
    an open circuit indicator with an anode connected to the power supply terminal;
    a short circuit indicator;
    a first interface and a second interface having a plurality of pins thereon, a first pin of the first interface connected to a cathode of the open circuit indicator, a second pin of the first interface connected to an anode of the short circuit indicator, a third pin grounded, the other pins of the first interface except the first pin, the second pin, the third pin, and a fourth pin connected, and the pins of the second interface connected, so that all wires of the cable are connected in series, even wires of the cable connected at one side of the short circuit indicator, and odd wires of the cable connected at the other side of the short circuit indicator; and
    a switch, in a short circuit test, the switch connecting the second pin and the fourth pin; in an open circuit test, the switch connecting the fourth pin and the cathode of the short circuit indicator and the open circuit indicator is shorted.

2. The apparatus as claimed in claim 1, wherein the switch is a double-pole double-throw (DPDT) switch with its first contact, second contact, third contact, fourth contact, and fifth contact connecting the anode of the open circuit indicator, the cathode of the open circuit indicator, the fourth pin, the anode of the short circuit indicator, and the cathode of the short circuit indicator respectively.

3. The apparatus as claimed in claim 1, wherein the switch comprises a single pole single throw (SPST) switch connected between the anode of the open circuit indicator and the cathode of the open circuit indicator, and a single-pole double throw (SPDT) switch connected between the fourth pin, the anode of the short circuit indicator, and the cathode of the short circuit indicator.

4. The apparatus as claimed in claim 1, wherein a resistor is connected between the power supply terminal and the open circuit indicator.

5. The apparatus as claimed in claim 1, wherein the open circuit indicator and the short circuit indicator are light emitting diodes.

6. The apparatus as claimed in claim 1, wherein the cable has two connectors at opposite ends respectively.

7. The apparatus as claimed in claim 6, wherein the two connectors of the cable are plugged into the first interface and the second interface respectively.

8. The apparatus as claimed in claim 7, wherein the cable has 40 wires thereon, the first pin, the second pin, the third pin, and the fourth pin are the pins a1, a39, a40, and a2 of the first interface respectively.

9. The apparatus as claimed in claim 7, wherein the cable has 40 wires, the first pin, the second pin, the third pin, and the fourth pin are the pins of a3, a9, a40, and a2 of the first interface respectively.

10. An apparatus adapted for testing a cable having a plurality of wires, the apparatus comprising:
    a power supply terminal;
    an open circuit indicator with an anode connected to the power supply terminal;
    a short circuit indicator;
    a first interface having a plurality of pins thereon, a first pin of the first interface connected to a cathode of the open circuit indicator, a second pin of the first interface connected to an anode of the short circuit indicator, a third pin grounded, every two adjacent odd pins shorted together, and every two adjacent even pins shorted together except the first pin, the second pin, the third pin, and the fourth pin;

a second interface having a plurality of pins thereon, every two adjacent odd pins shorted together, and every two adjacent even pins shorted together; and a switch, in short circuit test, the switch connecting the second pin and the fourth pin, in an open circuit test, the switch connecting the fourth pin and the cathode of the short circuit indicator and shorting the open circuit indicator.

11. The apparatus as claimed in claim 10, wherein the switch is a DPDT switch with its first contact, second contact, third contact, fourth contact, and fifth contact connect the anode of the open circuit indicator, the cathode of the open circuit indicator, the fourth pin, the anode of the short circuit indicator, and the cathode of the short circuit indicator respectively.

12. The apparatus as claimed in claim 10, wherein the switch comprises a single-pole single-throw (SPST) switch and a single-pole double throw (SPDT) switch.

13. The apparatus as claimed in claim 10, wherein a resistor is connected between the power supply and the open circuit indicator.

14. The apparatus as claimed in claim 10, wherein the open circuit indicator and the short circuit indicator are light emitting diodes.

15. The apparatus as claimed in claim 10, wherein the cable has two connectors at opposite ends thereof to be plugged into the first interface and the second interface respectively.

16. The apparatus as claimed in claim 15, wherein the cable has 40 wires therein, the first pin, the second pin, the third pin, and the fourth pin are the pins a1, a39, a40, and a2 of the first interface respectively.

17. The apparatus as claimed in claim 15, wherein the cable has 40 wires therein, the first pin, the second pin, the third pin, and the fourth pin are the pins a3, a9, a40, and a2 of the first interface respectively.

18. A method for testing a cable having a plurality of wires, comprising the steps of:

dividing a plurality of wires of a cable to be tested, parallel arranged to each other in said cable, into a first group of wires and a second group of wires;

electrically connecting said first group of wires serially;

electrically connecting said second group of wires serially; and electrically connecting an indicator with said first and second groups of wires serially so as to verify electrical transmission normality of said first and second groups of wires based on signals of said indicator.

19. The method as claimed in claim 18, wherein said indicator is used to verify possible open-circuit in said first and second groups of wires, and is electrically connectable serially at one connective end of a selective one of said first and second groups of wires opposite to the other of said first and second groups of wires.

20. The method as claimed in claim 18, wherein said indicator is used to verify possible short-circuit in said first and second groups of wires, and is electrically connectable serially between said first group of wires and said second group of wires.

* * * * *